United States Patent
Ho et al.

(10) Patent No.: US 7,180,166 B2
(45) Date of Patent: Feb. 20, 2007

(54) STACKED MULTI-CHIP PACKAGE

(75) Inventors: Kwun-Yao Ho, Hsin Tien (TW); Moriss Kung, Hsin Tien (TW)

(73) Assignee: Via Technologies, Inc., Hsin Tien (TW)

( * ) Notice: Subject to any disclaimer, the term of this patent is extended or adjusted under 35 U.S.C. 154(b) by 156 days.

(21) Appl. No.: 10/995,380

(22) Filed: Nov. 24, 2004

(65) Prior Publication Data

US 2005/0253224 A1    Nov. 17, 2005

(30) Foreign Application Priority Data

May 11, 2004   (TW) ................ 93113146 A

(51) Int. Cl.
- H01L 23/02 (2006.01)
- H01L 23/495 (2006.01)
- H01L 23/10 (2006.01)
- H01L 23/34 (2006.01)

(52) U.S. Cl. .............. 257/686; 257/675; 257/707

(58) Field of Classification Search ........ 257/685, 257/686, 675, 706, 707, 718, 720
See application file for complete search history.

(56) References Cited

U.S. PATENT DOCUMENTS

| | | | | |
|---|---|---|---|---|
| 5,579,208 A * | 11/1996 | Honda et al. | ................ | 361/813 |
| 5,780,926 A * | 7/1998 | Seo | ................ | 257/676 |
| 6,087,718 A * | 7/2000 | Cho | ................ | 257/686 |
| 6,190,944 B1 * | 2/2001 | Choi | ................ | 438/109 |
| 6,297,547 B1 * | 10/2001 | Akram | ................ | 257/676 |
| 6,476,467 B2 * | 11/2002 | Nakamura et al. | ................ | 257/668 |
| 6,483,181 B2 * | 11/2002 | Chang et al. | ................ | 257/686 |
| 6,528,870 B2 * | 3/2003 | Fukatsu et al. | ................ | 257/685 |
| 6,607,937 B1 * | 8/2003 | Corisis | ................ | 438/108 |
| 6,650,019 B2 * | 11/2003 | Glenn et al. | ................ | 257/777 |
| 6,670,701 B2 * | 12/2003 | Matsuura et al. | ................ | 257/686 |
| 6,680,525 B1 * | 1/2004 | Hsieh et al. | ................ | 257/680 |
| 6,690,089 B2 * | 2/2004 | Uchida | ................ | 257/686 |
| 6,737,738 B2 * | 5/2004 | Koh et al. | ................ | 257/686 |
| 6,777,795 B2 * | 8/2004 | Sasakura et al. | ................ | 257/686 |
| 6,777,798 B2 * | 8/2004 | Fukumoto et al. | ................ | 257/686 |
| 6,919,631 B1 * | 7/2005 | Hoffman et al. | ................ | 257/707 |
| 6,977,427 B2 * | 12/2005 | Hetzel et al. | ................ | 257/676 |
| 7,006,360 B2 * | 2/2006 | Kim | ................ | 361/790 |
| 2002/0066950 A1 * | 6/2002 | Joshi | ................ | 257/685 |
| 2002/0153599 A1 * | 10/2002 | Chang et al. | ................ | 257/676 |
| 2003/0042591 A1 * | 3/2003 | Goller et al. | ................ | 257/686 |
| 2003/0127721 A1 * | 7/2003 | Fukuda et al. | ................ | 257/686 |
| 2003/0127729 A1 * | 7/2003 | Fukumoto et al. | ................ | 257/723 |
| 2003/0205801 A1 * | 11/2003 | Baik et al. | ................ | 257/686 |
| 2003/0214023 A1 * | 11/2003 | Uchida | ................ | 257/686 |
| 2004/0108585 A1 * | 6/2004 | Hetzel et al. | ................ | 257/686 |
| 2004/0183180 A1 * | 9/2004 | Chung et al. | ................ | 257/686 |

* cited by examiner

*Primary Examiner*—Ngân V. Ngô
(74) *Attorney, Agent, or Firm*—Birch, Stewart, Kolasch, & Birch, LLP.

(57) ABSTRACT

A stacked multi-chip package comprising a substrate, a first chip, a lead frame, and a second chip is provided. The first chip is placed on and electrically connected with the substrate. The lead frame is placed on the substrate and forming a space therebeneath to accommodate the first chip. The second chip is placed to the lead frame and electrically connected with the substrate through the lead frame.

18 Claims, 4 Drawing Sheets

STACKED MULTI-CHIP PACKAGE

BACKGROUND OF THE INVENTION (1) Field of the Invention

The invention relates to a multi-chip package, and more particularly to a stacked multi-chip package.

(2) Description of the Prior Art

With the development of wireless communication network, the demand of portable communication apparatus, such as cell phones and personal digital assistants (PDA), is gradually increase. Meanwhile, the progress in the communication technology also promotes various types of specific services, such as digital music download, on-line chat room, on-line games, and messages delivery, provided on the cell phone. However, these services also lead to a great demand of large data transmission capacity. As a result, the requirement of memory chip with better performance facilitating the cell phone is becoming urgent.

For fabricating such memory chip, a variety of manufacturing technologies focusing on increasing memory cell density and reducing power consumption are regarded. However, such methods are quite costly and risky. By contrast, Stacked Multi-Chip Package (ST-MCP) technology, which is applied based on the existing chip manufacturing technologies but reduces the size of the chip package and the power consumption, is a much better solution in present.

FIG. 1 shows a cross-sectional view depicting a traditional stacked multi-chip package 100. The stacked multi-chip package 100 includes a first circuit board 110, a second circuit board 120, a third circuit board 130, a first chip 140, and a second chip 150. The first chip 140 is placed on the first circuit board 110 and electrically connected with the first circuit board 110. The second chip 150 is placed on the second circuit board 120 and electrically connected with the second circuit board 120. The third circuit board 130 is sandwiched between the first circuit board 110 and the second circuit board 120 and has an opening 132 aligning with the first chip 140 for offering a heat dissipation space A right above the first chip 140.

For electrically connecting the three circuit boards, a plurality of solder balls 160 are provided on the both surfaces of the third circuit board 130 to connect with the first circuit board 110 and the second circuit board 120. By the way, the signals from the second chip 150 may pass through the second circuit board 120 and the third circuit board 130 to reach the first circuit board 110, or even transmitted downward to a main board (not shown).

However, the traditional stacked multi-chip package 100 has the following drawbacks. Firstly, the solder balls 160 sandwiched between the three circuit board 110, 120, and 130 lead to a significant increase in the package thickness and cost. Secondly, the density of the contacts of the traditional stacked multi-chip package 100 is restricted by the pitch P of the adjacent solder balls 160 and is impossible to increase without limitation. Thirdly, the layout of the circuits on the first circuit board 110, the second circuit board 120, and the third circuit board 130 is restricted by the arrangement of the solder balls 160, and may lead to an inconvenience for circuit design. Fourthly, the third circuit board 130 sandwiched between the first circuit board 110 and the second circuit board 120 has the opening 132 to offer the heat dissipation space A for improving heat dissipation rate of the first chip 140. However, an additional third circuit board 130 leads to a tremendous increase in package thickness, meanwhile the package cost.

With the increasing demand of stacked multi-chip packages, how to modify the traditional stacked multi-chip package to achieve the goals of high heat dissipation efficiency and small package size has become a major issue of package technologies nowadays.

SUMMARY OF THE INVENTION

Accordingly, it is an object of the present invention to provide a stacked multi-chip package focusing on the above mentioned disadvantages of the traditional stacked multi-chip package It is another object of the present invention to increase the heat dissipation rate of the chip by placing a heat spreader on the chip.

The stacked multi-chip package provided in the present invention includes a substrate, a first chip, a lead frame, and a second chip. The first chip is placed on and electrically connected with the substrate. The lead frame is placed on the substrate and forming a space therebeneath to accommodate the first chip. The second chip is placed on the lead frame and electrically connected with the substrate through the lead frame.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 2:
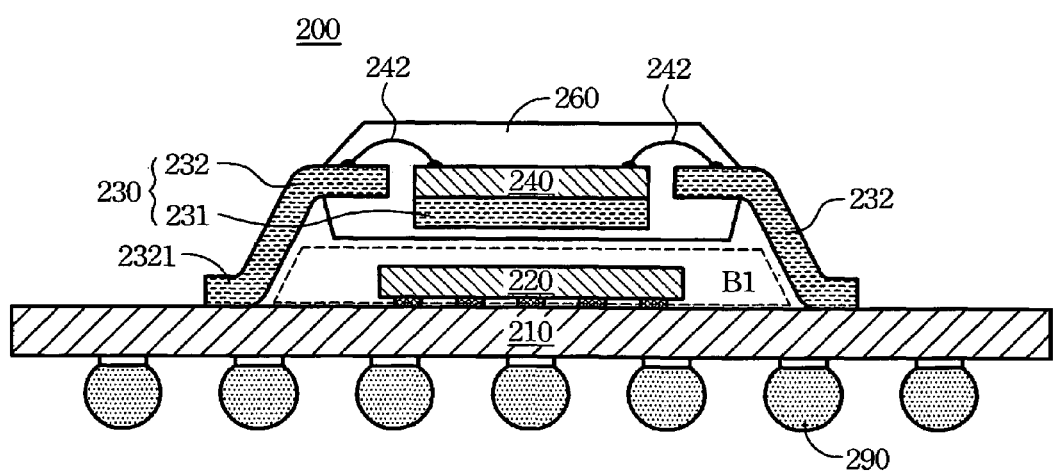
FIG. 2 is a schematic cross-section view depicting a first preferred embodiment of the stacked multi-chip package in accordance with the present invention.

FIG. 2 is a cross-section view depicting a first preferred embodiment of the stacked multi-chip package 200 in accordance with the present invention. The present stacked multi-chip package 200 includes a substrate 210, a first chip 220, a lead frame 230, a second chip 240, and a molding layer 260.

The substrate 210 is basically a packaging circuit board, which has a plurality of electric contacts formed on a lower surface thereof. Some connecting means, such as solder balls 290 shown in FIG. 2 or pins, are attached on the contacts for electrically connected to a printed circuit board (not shown). The first chip 220 is placed on the substrate 210, and electrically connected with the substrate 210 by using flip chip packaging technology, such as Ball Grid Array (BGA) or Land Grid Array (LGA) technology. The lead frame 230 includes a planar portion 231 and a plurality of lead fingers 232. The lead fingers 232 are extended from the edges of the planar portion 231 downward to an upper surface of the substrate 210 so as to electrically connect with the traces (not shown) on the substrate 210. The lead fingers 232 also serve as a partition structure supporting the planar portion 231 and offering a space B1, which is located between the planar portion 231 and the substrate 210 for accommodating the first chip 220. As a preferred embodiment, each of the lead fingers 232 has a horizontal portion 2321 close to a lower end thereof for attaching to the upper surface of the substrate 210. The horizontal portions 2321 are utilized to increase the contact area between the lead fingers 232 and the substrate 210, and thus stabilize the lead frame 230. In addition, by changing the positions of the horizontal portions 2321 to vary the extending directions of the lead fingers 232 or adjusting the length of the lead fingers 232, a space B1 may be formed under the lead frame 230 to accommodate first chips 220 with various dimensions.

The second chip 240 is placed on an upper surface of the planar portion 231. A plurality of wires 242 are bonded between the bonding pads (not shown) formed on the second chip 240 and the lead fingers 232. Thereby, the signals generated from the second chip 240 may be transmitted to the substrate 210 through the wires 242 and the lead fingers 232, and even output from the substrate 210. Furthermore, in order to prevent the second chip 240 and the plurality of wires 242 from being damaged by external mechanical forces or chemical reactions, the molding layer 260 is formed on the lead fingers 232 to encapsulate the second chip 240 and the wires 242.

Figure 3A:
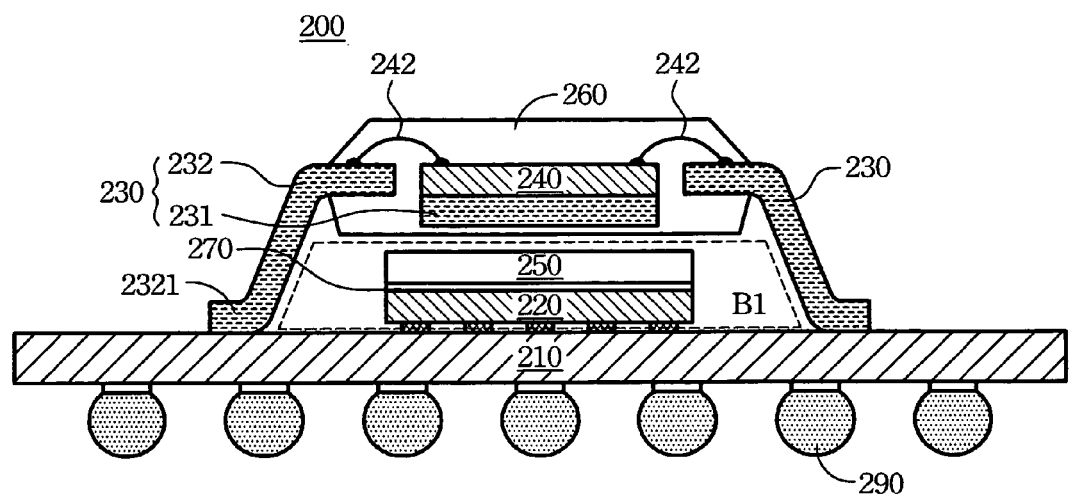
FIG. 3A is a schematic cross-section view depicting a second preferred embodiment of the stacked multi-chip package in accordance with the present invention.

In this embodiment, the second chip 240 is located close to a top edge of the stacked multi-chip package 200, therefore, the heat generated by the second chip 240 can be effectively dissipated. However, as the first chip 220 is located deep inside the package 200, the heat generated by the first chip 220 is difficultly dissipated. In order to increase heat dissipation rate of the first chip 220, as shown in the second preferred embodiment of FIG. 3A, a thermal conductive adhesive layer 270 is pasted on an upper surface of the first chip 220 for attaching a heat spreader 250 directly. It should be noted that the first chip 220 is placed on and electrically connected with the substrate 210 by using flip chip packaging technology, which implies that the bonding pads (not shown) of the first chip 220 are arranged on a bottom surface thereof. Therefore, the dimension of the heat spreader 250 can be equal to or even larger than the dimension of the first chip 220 for offering a bigger dissipation area.

Figure 3B:
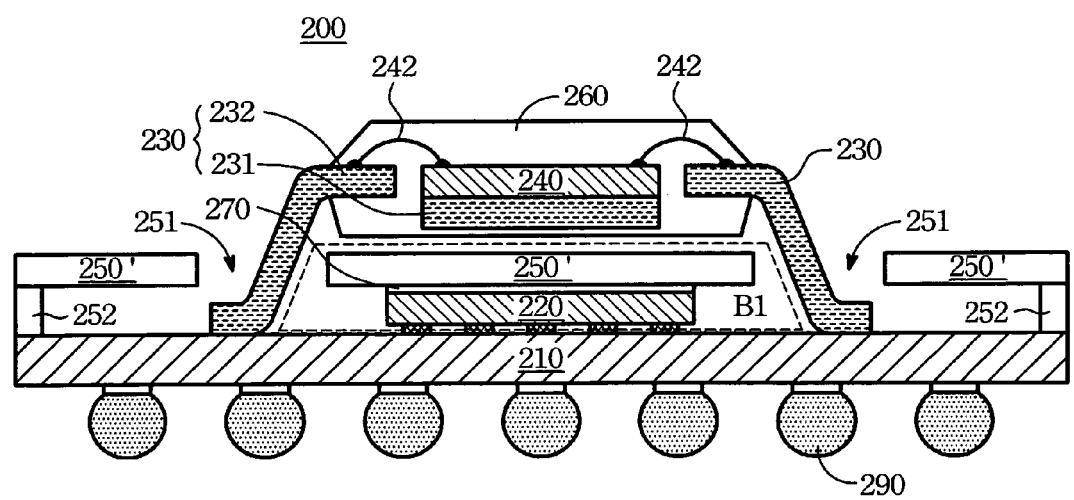
FIG. 3B is a schematic cross-section view depicting a third preferred embodiment of the stacked multi-chip package in accordance with the present invention.

In the second embodiment mentioned above, the heat spreader 250 is placed in the space B1 under the lead frame 230. That is, the width of the heat spreader 250 is smaller than the width of the lead frame 230. In order to provide a greater heat dissipation rate, a heat spreader 250', which is wider than the lead frame 230, is used in a third embodiment of the present invention as shown in FIG. 3B. The heat spreader 250' has at least an opening 251 formed thereon to place the lead fingers 232 on the substrate 210. In addition, for increasing the strength of the package 200 shown in FIG. 3B, two supporting means 252 can be further interposed between the edges of the heat spreader 250' and the substrate 210.

Figure 4:
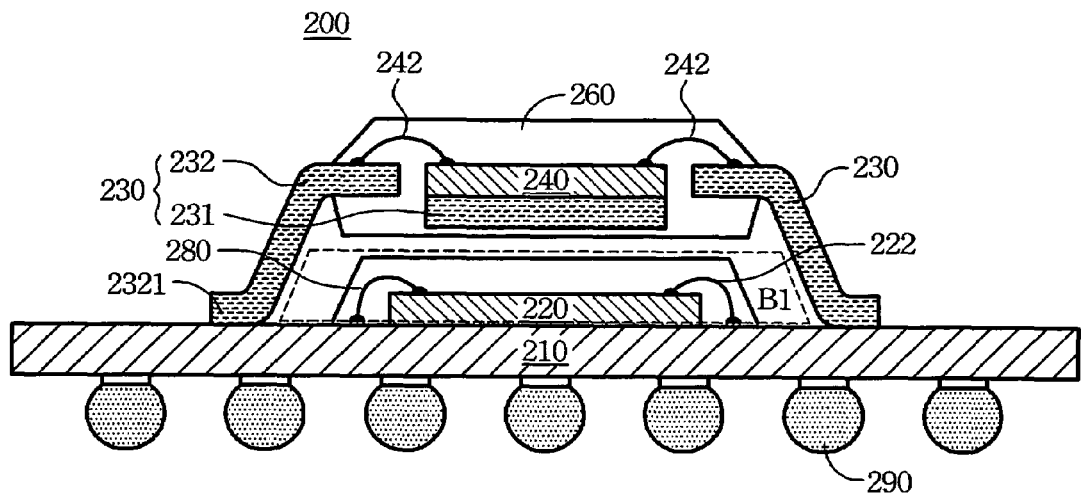
FIG. 4 is a schematic cross-section view depicting a fourth preferred embodiment of the stacked multi-chip package in accordance with the present invention.

FIG. 4 is a cross-sectional view depicting a forth preferred embodiment of the present stacked multi-chip package. In contrast to the first embodiment, the present embodiment utilizes wire-bonding (WB) technology for connecting the first chip 220 to the substrate 210. Meanwhile, a molding layer 280 is formed on the substrate 210 to encapsulate the first chip 220 and the bonding wires 222 nearby for preventing the first chip 220 and the wires 222 from being damaged by external mechanical forces or chemical reactions.

Figure 5:
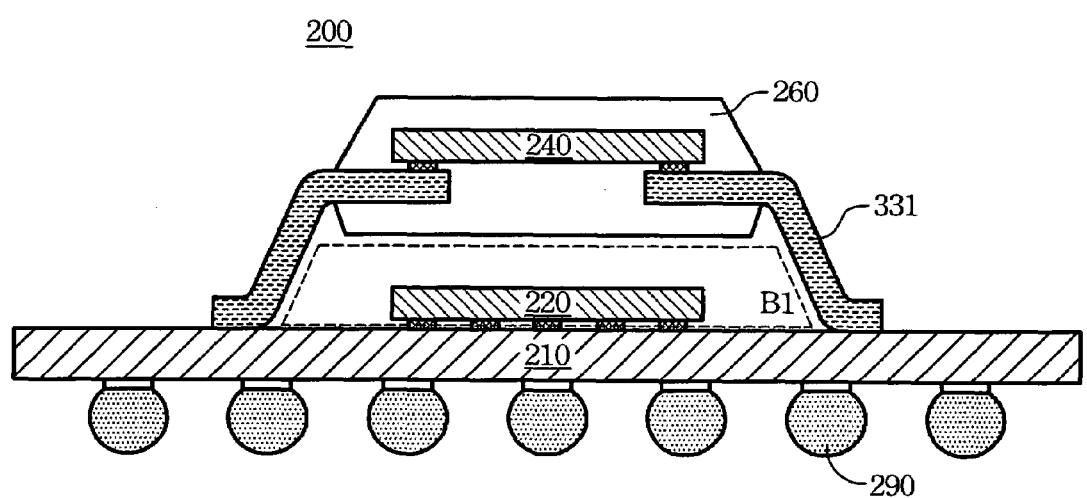
FIG. 5 is a schematic cross-section view depicting a fifth preferred embodiment of the stacked multi-chip package in accordance with the present invention.

FIG. 5 is a cross-sectional view depicting a fifth preferred embodiment of the present stacked multi-chip package. The present embodiment utilizes a plurality of lead fingers 331 to connect with the second chip 240 directly. Each of the lead fingers 331 has an upper end connected with the pads formed on a bottom surface of the second chip 240 and a lower end extending downward to the upper surface of substrate 210. That is, the second chip 240 is connected with the substrate 210 through lead fingers 331 by using flip chip packaging technology. In addition, there is a molding layer 260 encapsulating the second chip 240 and the adjacent lead fingers 331 so as to protect the connections between the second chip 240 and the lead fingers 331, and meanwhile prevent the second chip 240 from being damaged by external mechanical forces or chemical reactions.

Figure 6:
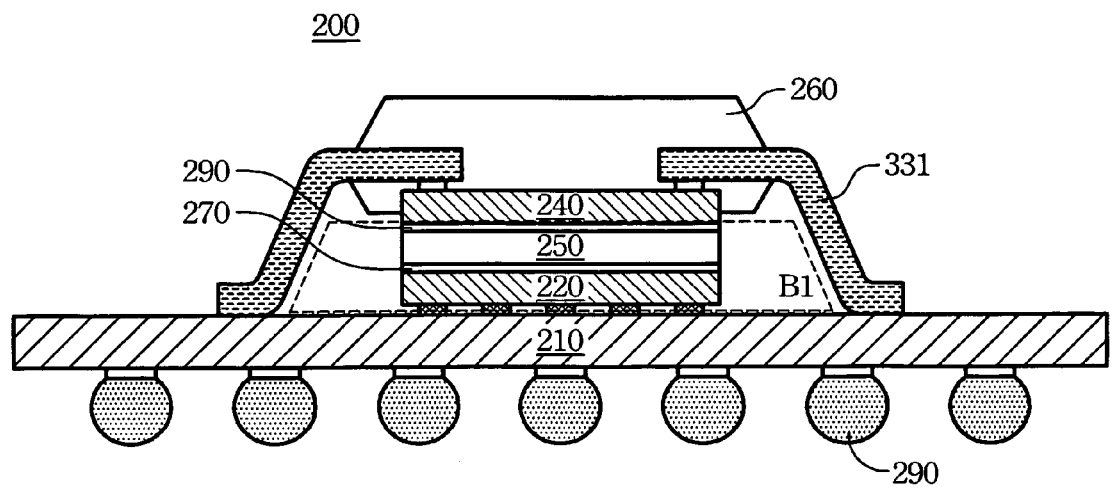
FIG. 6 is a schematic cross-section view depicting a sixth preferred embodiment of the stacked multi-chip package in accordance with the present invention.

FIG. 6 is a cross-section view depicting a sixth preferred embodiment of the present stacked multi-chip package. In contrast to the fourth embodiment, the second chip 240 of the present embodiment is flipped so that the pads (not shown) on the second chip 240 are facing upward to connect with the lead fingers 331 by using flip chip packaging technology also. In addition, a molding layer 260 is formed on the second chip 240 and encapsulates the second chip 240 and the adjacent lead fingers 331 so as to protect the connection between the second chip 240 and the lead fingers 331. Moreover, a heat spreader 250 is interposed between the first chip 220 and the second chip 240, and connected with the upper surface of the first chip 220 and the bottom surface of the second chip 240 by using the thermal conductive adhesive layers 270 and 290 respectively. The heat spreader 250 is utilized to increase the heat dissipation efficiency, especially for the first chip 240 of the present package, and also serves as a partition structure between the first chip 220 and the second chip 240, which strengthens the package. It should be noted that the heat spreader 250' shown in FIG. 3B is also applicable to the present embodiment.

Figure 7:
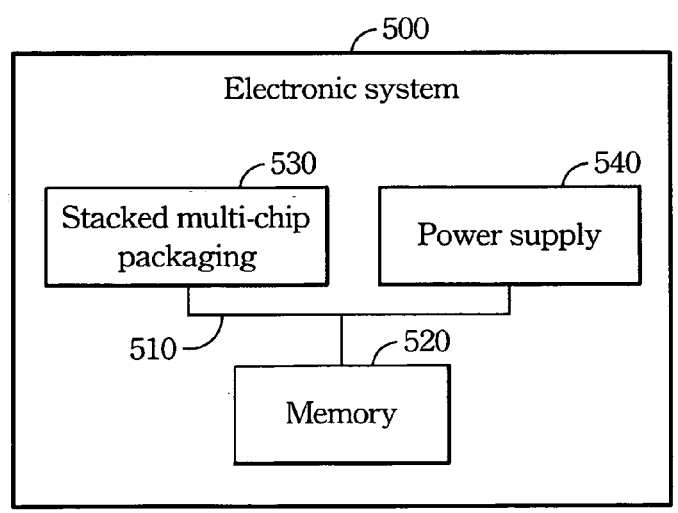
FIG. 7 is a block diagram depicting a preferred embodiment of the electronic system in accordance with the present invention.

FIG. 7 is a block diagram depicting a preferred embodiment of the electronic system 500 in accordance with the present invention. The present electronic system 500 includes a bus 510, a memory 520, a stacked multi-chip package 530 and a power supply 540. The memory 520, the stacked multi-chip package 530 and the power supply 540 are communicated with each other through the bus 510. Also referring to FIG. 2, the present stacked multi-chip package 530 includes a substrate, a first chip, a lead frame, and a second chip. In addition, the substrate is electrically connected with the bus 510 through some connecting means provided therebeneath. Accordingly, the signals generated by the first chip or the second chip can be transmitted over the bus 510 to control the operation of the electronic system 500.

The above-mentioned first chip or second chip may be a microprocessor, such as a computer processing unit (CPU), or a system chip. In addition, the signals from the first chip and the second chip are exchangeable within the package to meet the requirements of system on package (SOP).

In contrast with the traditional stacked multi-chip package, the present invention has the following advantages.

Figure 1:
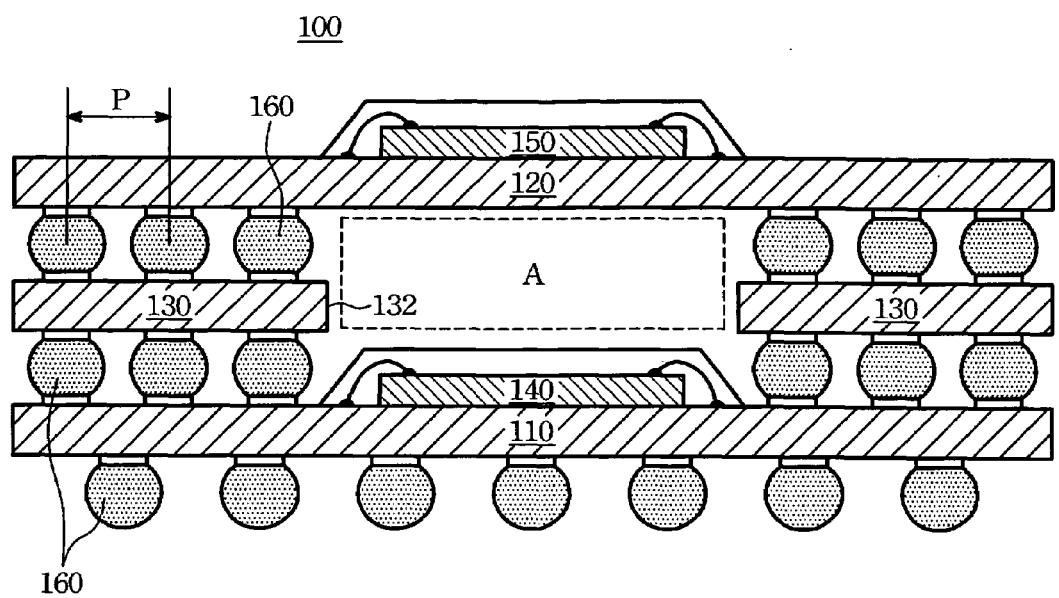
FIG. 1 is a schematic cross-section view of the traditional stacked multi-chip package.

Firstly, by contrast with the three-tier structure shown in the traditional stacked multi-chip package 100 of FIG. 1, the present stacked multi-chip package 200 utilizes the lead frame 230 to support the second chip 240 and presents a two-tier structure. Therefore, package thickness reduces significantly and cost is predictable.

Secondly, the present stacked multi-chip package 200 may arrange a heat spreader 250 right on the upper surface of the first chip 220 to provide a better heat dissipation efficiency.

Thirdly, by contrast with a significant area on the substrates occupied by the solder balls 160 within the traditional stacked multi-chip package 100, the lead frame 230 in the present stacked multi-chip package 200 is utilized to functional replace the solder balls 160 so as to form a bigger surface area on the substrate 210 for circuit layout.

Fourthly, it is noted that the contact density of the traditional stacked multi-chip package 100 is severely affected by the pitch of the solder balls 160. The present stacked multi-chip package 200 uses the lead frame 230 to functional replace the solder balls 160, so that the limitation from the solder balls is no longer existed and a higher contact density can be achieved.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments, which do not depart from the spirit and scope of the present invention.

We claim:

1. A stacked multi-chip package, comprising:
   a substrate;
   a first chip placed on and electrically connected with the substrate by using flip chip packaging technology;
   a lead frame placed on the substrate and forming a space therebeneath to accommodate the first chip;
   a second chip placed on the lead frame and electrically connected with the substrate through the lead; and
   a heat spreader, placed on an upper surface of the first chip, which is away from the substrate respectively, and attached to the upper surface by using a thermal conductive adhesive layer;
   wherein the dimension of the heat spreader being wider than the lead frame and the heat spreader having at least an opening for placing the lead frame.

2. The stacked multi-chip package according to claim 1, wherein the second chip is placed on the lead frame and electrically connected with the substrate through the lead frame by using flip chip packaging technology.

3. The stacked multi-chip package according to claim 1, wherein the second chip is placed on the lead frame and electrically connected with the substrate through the lead frame by using wire-bonding (WB) technology.

4. The stacked multi-chip package according to claim 1, wherein the second chip is placed on an upper surface of the lead frame.

5. The stacked multi-chip package according to claim 1, wherein the second chip is placed on a bottom surface of the lead frame.

6. The stacked multi-chip package according to claim 1, further comprising a molding layer encapsulating the second chip for isolating the second chip from the environment.

7. The stacked multi-chip package according to claim 1, wherein the heat spreader is sandwiched between the first chip and the second chip.

8. The stacked multi-chip package according to claim 1, wherein the substrate is a circuit board comprising a plurality of contacts formed on a bottom surface thereof.

9. The stacked multi-chip package according to claim 8, wherein the contacts are attached with solder balls or pins.

10. An electronic system, comprising:
    a bus;
    a memory connected with the bus; and
    a stacked multi-chip package connected with the bus including:
      a substrate;
      a first chip placed on and electrically connected with the substrate by using flip chip packaging technology;
      a lead frame placed on the substrate and forming a space therebeneath to accommodate the first chip;
      a second chip placed on the lead frame and electrically connected with the substrate through the lead frame; and
      a heat spreader, placed on an upper surface of the first chip, which is away from the substrate respectively, and attached to the upper surface by using a thermal conductive adhesive layer;
    wherein the dimension of the heat spreader being wider than the lead frame and the heat spreader having at least an opening for placing the lead frame.

11. The electronic system according to claim 10, wherein the second chip is placed on and electrically connected with the substrate by using flip chip packaging technology.

12. The electronic system according to claim 10, wherein the second chip is placed on the lead frame and electrically connected with the substrate through the lead frame by using wire-bonding (WB) technology.

13. The electronic system according to claim 10, wherein the second chip is placed on an upper surface of the lead frame.

14. The electronic system according to claim 10, wherein the second chip is placed on a bottom surface of the lead frame.

15. The electronic system according to claim 10, further comprising a molding layer encapsulating the second chip for isolating the second chip from the environment.

16. The electronic system according to claim 10, wherein the heat spreader is sandwiched between the first chip and the second chip.

17. The stacked multi-chip package according to claim 10, wherein the substrate is a circuit board comprising a plurality of contacts on the lower surface thereof for electrically connecting with the bus.

18. The electronic system according to claim 17, wherein the contacts are attached with solder balls or pins.

* * * * *